United States Patent [19]
Hisada et al.

[11] Patent Number: 5,914,505
[45] Date of Patent: Jun. 22, 1999

[54] SEMICONDUCTOR INTEGRATED CIRCUIT

[75] Inventors: Toshiki Hisada; Hiroyuki Koinuma, both of Yokohama, Japan

[73] Assignee: Kabushiki Kaisha Toshiba, Kawasaki, Japan

[21] Appl. No.: 08/706,394

[22] Filed: Aug. 30, 1996

[30] Foreign Application Priority Data

Sep. 1, 1995 [JP] Japan .................................. 7-225387

[51] Int. Cl.⁶ .................................................. H01L 27/10
[52] U.S. Cl. ............................ 257/207; 257/369; 326/26
[58] Field of Search ................................... 257/207, 369, 257/666; 326/26; 361/56

[56] References Cited

U.S. PATENT DOCUMENTS

| 5,111,069 | 5/1992 | Deierling et al. | 257/369 |
| 5,144,161 | 9/1992 | Inaba | 326/26 |
| 5,293,559 | 3/1994 | Kim et al. | 257/207 |
| 5,394,008 | 2/1995 | Ito et al. | 257/666 |
| 5,608,594 | 3/1997 | Fukuda | 361/111 |

*Primary Examiner*—Sara Crane
*Attorney, Agent, or Firm*—Banner & Witcoff, Ltd.

[57] ABSTRACT

A semiconductor integrated circuit includes an input circuit for receiving an input signal from the outside, an internal circuit connected to the input circuit, an output circuit connected to the internal circuit for outputting an output signal to the outside, a power supply line connected to each of the circuits, a power supply terminal connected to the power supply line, a first ground conductor connected to the input circuit, a second ground conductor separated from the first ground conductor and connected to the internal circuit, a first ground terminal connected to the first ground conductor and a second ground terminal connected to the second ground conductor. Because of the provision of the ground conductor exclusively for the input circuit, malfunction of the input circuit due to power supply fluctuations is prevented and an operation margin is increased.

35 Claims, 8 Drawing Sheets

SEMICONDUCTOR INTEGRATED CIRCUIT

BACKGROUND OF THE INVENTION

1. Field of the Invention

The present invention relates to a semiconductor integrated circuit. More particularly, the invention relates to an output noise processing circuit in the semiconductor integrated circuit utilized in, for instance, a dynamic type semiconductor memory (DRAM).

2. Description of the Related Art

Figure 10:
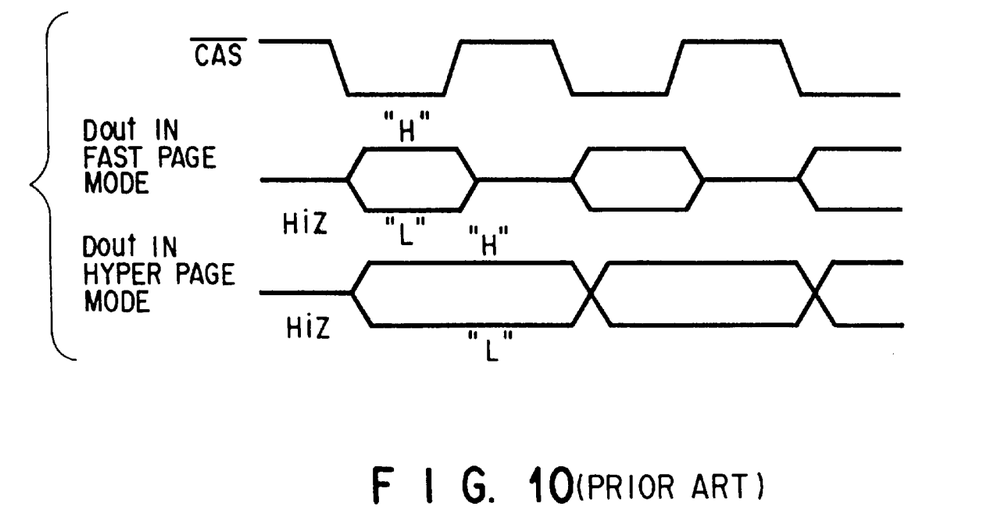
FIG. 10 is a timing wave form chart showing a read operation in a fast page mode and a read operation in a hyper page mode in conventional DRAM of a multibit configuration.

In a conventional DRAM of a multibit structure, as shown in FIG. 10, in a fast page mode as one kind of reading operation, output data Dout is output corresponding to the active period of a /CAS (/Column Address Strobe) signal and during other periods an output is placed in a high impedance state (HiZ). Output data Dout in the fast page mode changes between a high level "H" and a high impedance or between a low level "L" and a high impedance.

In a hyper page mode as another kind of reading operation (Extended Data Output mode: EDO mode), as shown in FIG. 10, output data Dout is switched in synchronization with the leading edge of a /CAS signal. This mode is advantageous, since a cycle time can be made short by an amount equivalent to widening of an output window width.

However, since Dout in the hyper page mode changes between a high level "H" and a low level "L", output noises (fluctuations in power source potential or ground potential) are large following a change in output data, especially in the DRAM of a multibit structure. As a result, it is easy for an internal circuit (especially an input circuit) to malfunction due to output noises.

As described above, for the conventional DRAM of a multibit structure, the problem has been that output noises are large in the hyper page mode and thus it is easy for the internal circuit to malfunction due to output noises.

SUMMARY OF THE INVENTION

The present invention has been made to solve the above-noted problem. It is an object of the invention to provide a semiconductor integrated circuit capable of preventing an internal circuit from malfunctioning because of output noises following a change in output data.

In accordance with a first aspect of the present invention, a semiconductor integrated circuit is provided with the following elements: an input circuit for receiving an input signal from the outside; an internal circuit connected to the input circuit; an output circuit connected to the final stage of the internal circuit for supplying an output signal to the outside; a power supply line connected to each of the circuits; a power supply terminal connected to the power supply line; a first ground conductor connected to the input circuit; a second ground conductor separated from the first ground conductor and connected to the internal circuit; a third ground conductor separated from the first ground conductor and connected to the output circuit; a first ground terminal connected to the first ground conductor; and a second ground terminal connected to the second ground conductor.

In accordance with a second aspect of the present invention, a semiconductor integrated circuit is provided with the following elements: an input circuit for receiving an input signal from the outside; a succeeding-stage circuit connected to the input circuit; an internal circuit connected to the succeeding-stage circuit; an output circuit connected to the final stage of the internal circuit for supplying an output signal to the outside; a power supply line connected to each of the circuits; a power supply terminal connected to the power supply line; a first ground conductor connected to the input and succeeding-stage circuits; a second ground conductor separated from the first ground conductor and connected to the internal circuit; a first ground terminal connected to the first ground conductor; and a second ground terminal connected to the second ground conductor.

In accordance with a third aspect of the present invention, a semiconductor integrated circuit is provided with the following elements: a plurality of input circuits for respectively receiving different input signals from the outside; a plurality of succeeding-stage circuits respectively connected to the plurality of input circuits in a corresponding manner; an internal circuit connected to the succeeding-stage circuits; a plurality of output circuits connected to the final stage of the internal circuit for supplying output signals to the outside; a power supply line connected to each of the circuits; a power supply terminal connected to the power supply line; a first ground conductor connected to the plurality of input circuits and some of the plurality of succeeding-stage circuits; a second ground conductor separated from the first ground conductor and connected to the internal circuit and the rest of the plurality of succeeding-stage circuits; a first ground terminal connected to the first ground conductor; and a second ground terminal connected to the second ground conductor.

In accordance with a fourth aspect of the present invention, a semiconductor integrated circuit is provided with the following elements: an input circuit for receiving an input signal from the outside; an internal circuit connected to the input circuit; an output circuit connected to the internal circuit for outputting an output signal to the outside; a power supply line connected to each of the circuits; a power supply terminal connected to the power supply line; a first ground conductor connected to the input circuit; a second ground conductor separated from the first ground conductor and connected to the internal and output circuits; a first ground terminal connected to the first ground conductor; and a second ground terminal connected to the second ground conductor.

In accordance with a fifth aspect of the present invention, a semiconductor integrated circuit is provided with the following elements: ground conductors separated into a plurality of routes on a semiconductor substrate; a first circuit for receiving an input signal from the outside; a second circuit for receiving an output from the first circuit; wherein a first ground conductor, one of the ground conductors separated into the plurality of routes, is used as a ground conductor only for the first circuit and the ground conductors other than the first ground conductor are used as ground conductors for circuits other than the first circuit. The semiconductor integrated circuit may further comprise an output circuit for outputting an output signal to the outside, wherein one of the ground conductors separated into the plurality of routes is used exclusively for the output circuit.

In accordance with a sixth aspect of the present invention, a semiconductor integrated circuit is provided with the following elements: an input circuit for receiving an input signal from the outside; a succeeding-stage circuit connected to the input circuit; an internal circuit connected to the succeeding-stage circuit; an output circuit connected to the internal circuit for outputting an output signal to the outside; a power supply line connected to each of the circuits; a power supply terminal connected to the power supply line; a first ground conductor connected to the input and succeeding-stage circuits; a second ground conductor separated from the first ground conductor and connected to the output circuit; a third ground conductor separated from the ground conductor and connected to the output circuit; a first ground terminal connected to the first ground conductor; and a second ground terminal connected to the second ground conductor. In the semiconductor integrated circuit, the power supply line is commonly connected to each of the circuits and the second and third ground conductors are formed in a common manner. The semiconductor integrated circuit may comprise a third ground terminal connected to the third ground conductor, wherein the power supply line includes a first power supply line commonly connected to the input and internal circuits and a second power supply line separated from the first power supply line and connected to the output circuit, the power supply terminal includes a first power supply terminal connected to the first power supply line and a second power supply terminal connected to the second power supply line, and the second and third ground conductors are separated from each other. In the semiconductor integrated circuit, the power supply terminals are respectively connected to ground terminals separated into a plurality of routes outside an integrated circuit chip. In the semiconductor integrated circuit, the ground terminals are respectively connected to ground terminals separated into a plurality of routes outside an integrated circuit chip. In the semiconductor integrated circuit, the input and succeeding-stage circuits are respectively provided with NMOS transistors formed on a p type well formed in a n-type semiconductor substrate, the first ground conductor is connected to a source region for the NMOS transistor comprising a n-type impurity diffused layer formed in the p type well, the second ground conductor is connected to a p type well electrode region comprising a p-type impurity diffused layer formed in said p type well, and a p-n junction diode formed between the p type well and the source region of said NMOS transistor exists between the second ground conductor and the first ground conductor. In the semiconductor integrated circuit, another diode in a direction opposite the p-n junction diode is further provided between the second ground conductor and the first ground conductor.

In accordance with a seventh aspect of the present invention, a semiconductor integrated circuit is provided with the following elements: ground conductors separated into a plurality of routes on a semiconductor substrate; a plurality of first circuits for respectively receiving different input signal from the outside; and a plurality of second circuits respectively corresponding to the plurality of first circuits for receiving outputs therefrom, wherein a first ground conductor, one of the ground conductors separated into the plurality of routes is used as a ground conductor only for the plurality of first circuits and some of succeeding-stage circuits of the plurality of second circuits, and the ground conductors other than the first ground conductor are used as ground conductors for circuits other than the first and second circuits and remaining succeeding-stage circuits of the plurality of second circuits.

In accordance with an eighth aspect of the present invention, a semiconductor integrated circuit is provided with the following elements: a plurality of input circuits for respectively receiving different input signals from the outside; a plurality of succeeding-stage circuits respectively connected to the plurality of input circuits in a corresponding manner; an internal circuit connected to the succeeding-stage circuits; a plurality of output circuits connected to the internal circuit for respectively outputting output signals to the outside; a power supply line connected to each of the circuits; a power supply terminal connected to the power supply line; a first ground conductor connected to the plurality of input circuits and some of the plurality of succeeding-stage circuits; a second ground conductor separated from the first ground conductor and connected to the internal circuit and the rest of the plurality of succeeding-stage circuits; a third ground conductor separated from the first ground conductor and connected to the output circuits; a first ground terminal connected to the first ground conductor; and a second ground terminal connected to the second ground conductor. In the semiconductor integrated circuit, some of the plurality of succeeding-stage circuits to which the first ground conductor is connected are CMOS inverter circuits, of the plurality of input circuits, the ones in the preceding stage of the CMOS inverter circuits are CMOS Schmitt circuits, and input signals received by the CMOS Schmitt circuits are placed in a high impedance state while the output circuits provide output signals. In the semiconductor integrated circuit, of the plurality of succeeding-stage circuits, the ones to which the second ground conductor is connected are CMOS inverter circuits. Further, of the plurality of input circuits, the ones in the preceding stage of the CMOS inverter circuits are CMOS Schmitt circuits, and input signals input to the CMOS Schmitt circuits cause the CMOS Schmitt circuits to be low levels while the output circuits provide output signals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The preferred embodiments of the invention will now be described in detail with reference to the accompanying drawings.

Figure 1:
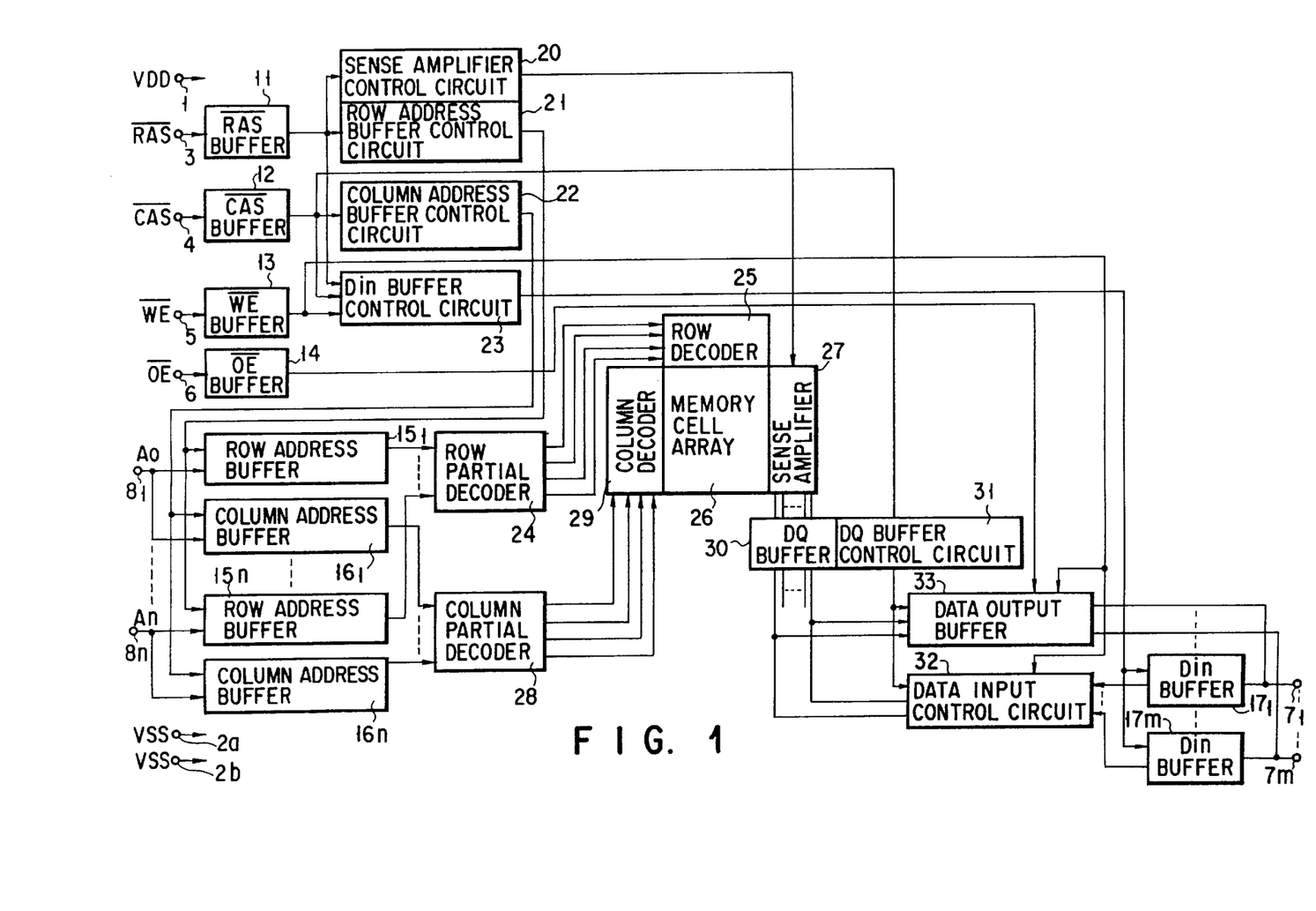
FIG. 1 is a block diagram showing a structure of DRAM of a multibit configuration in a first embodiment of a semiconductor integrated circuit of the invention.

FIG. 1 illustrates in a schematic block diagram a structure of DRAM of a multibit configuration in a first embodiment of a semiconductor integrated circuit of the invention.

In the drawing, a reference character 1 represents a power supply terminal to which a power source potential VDD is applied from the outside, 2a and 2b first and second ground terminals respectively to which a ground potential VSS is provided from the outside, 3 a /RAS terminal to which a /RAS (/Row Address Strobe) signal is input from the outside, 4 a /CAS terminal to which a /CAS is input from the outside, 5 a /WE terminal to which a /WE (/Write Enable) signal is input from the outside and 6 a /OE terminal to which a /OE (Output Enable) signal is input from the outside.

Reference characters $7_1$ to $7_m$ are input/output terminals to which write data Din are input from the outside or from which data output Dout inside DRAM are output to the outside. $8_1$ to $8_n$ are address terminals to which address signals A0 to An are input from the outside.

A reference character 11 represents a /RAS buffer to which the /RAS signal is input, 12 a /CAS buffer to which the /CAS signal is input, 13 a /WE buffer to which the /WE signal is input, 14 a /OE buffer to which the /OE signal is input, $15_1$ to $15_n$ row address buffers to which row address signals of the address signals A0 to An input from the address terminals $8_1$ to $8_n$ are input, $16_1$ to $16_n$ are column address buffers to which column address signals of the address signals A0 to An input from the address terminals $8_1$ to $8_n$ are input and $17_1$ to $17_m$ are Din buffers to which data Din input from the input/output terminals $7_1$ to $7_m$ are input.

A reference character 20 represents a sense amplifier control circuit for producing a sense amplifier control signal based on the output of the /RAS buffer 11, 21 a row address buffer control circuit for producing a row address buffer control signal based on the output of the /RAS buffer, 22 a column address buffer control circuit for producing a column address buffer control signal based on the output of the /CAS buffer 12, 23 a Din buffer control circuit for producing a data input buffer control signal based on the outputs of the /RAS buffer 11, the /CAS buffer 12 and /WE buffer 13.

Reference characters 24 and 25 represent a predecoding row partial decoder and a row main decoder for decoding the outputs of the row address buffers $15_1$ to $15_n$.

A reference character 26 represents a memory cell array in which row selection is performed based on the output of the row decoder 25, and 27 a sense amplifier for detecting a reading potential from the memory cell array 26.

Reference characters 28 and 29 represent a predecoding column partial decoder and a column main decoder for decoding the outputs of the column address buffers $16_1$ to $16_n$.

A reference character 30 represents a DQ buffer inserted into a data line pair for performing input/output of data with a column selected and controlled based on the output of the column decoder 29, and 31 a DQ buffer control circuit controlled based on the output of the /CAS buffer 12 for controlling the DQ buffer 30.

A reference character 32 represents a data input control circuit provided between the DQ buffer 30 and the Din buffers $17_1$ to $17_m$ and controlled based on the output of the /WE buffer 13 for outputting the data inputs Din of the Din buffer $17_1$ to $17_m$ to the DQ buffer 30.

A reference character 33 represents a data output buffer provided between the DQ buffer 30 and the input/output terminals $7_1$ to $7_m$ and controlled based on the outputs of the /WE buffer 13 and the /OE buffer 14 for outputting the output of the DQ buffer 30 as output data Dout to the input/output terminals $7_1$ to $7_m$.

Figure 2:
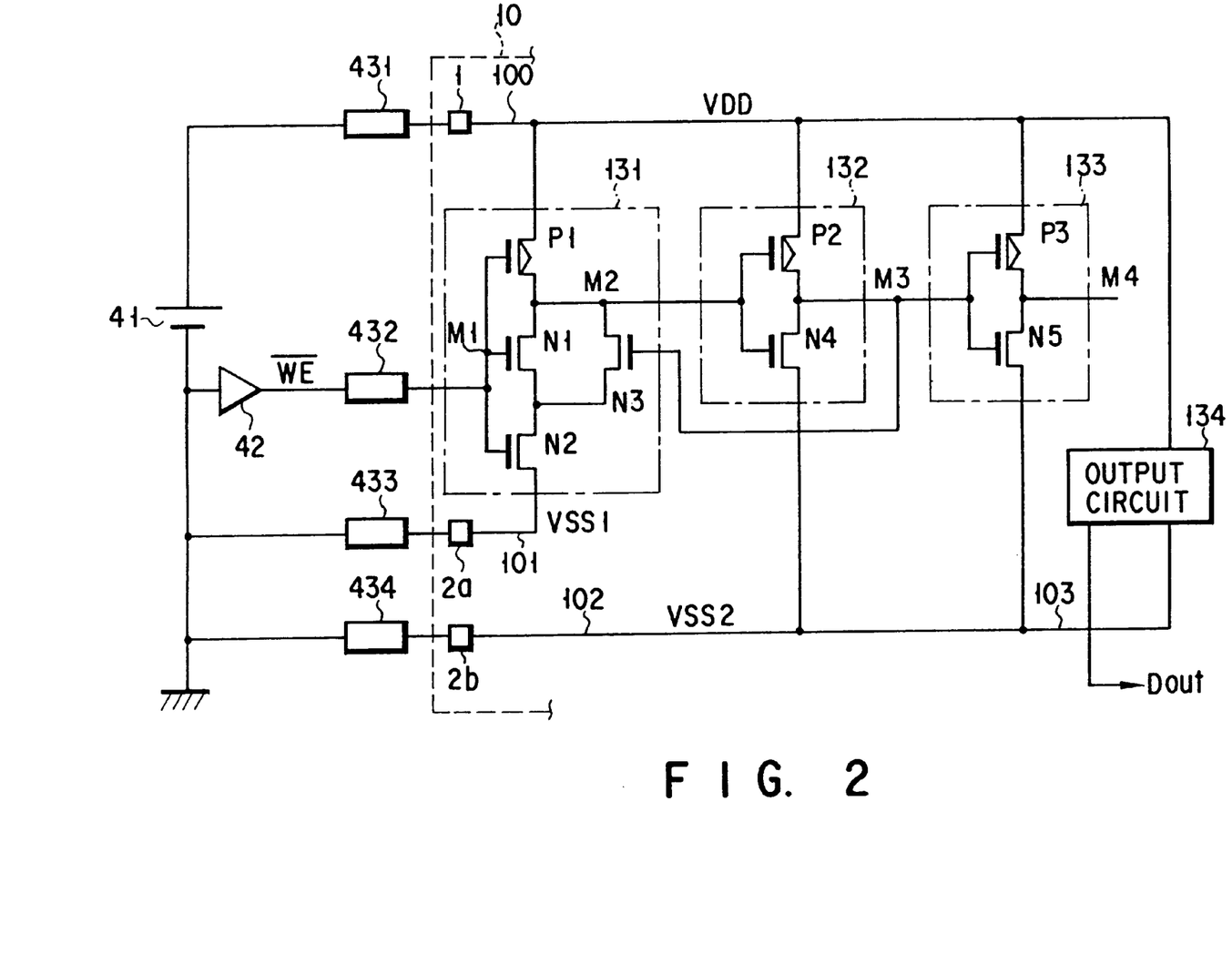
FIG. 2 is a circuit diagram showing one input buffer circuit and its peripheral circuit extracted from FIG. 1 and an external structure of an integrated circuit chip associated therewith.

FIG. 2 illustrates one of the input buffer circuits and its peripheral circuit shown in FIG. 1 and the external structure of an integrated circuit chip associated therewith.

In FIG. 2, a reference character 10 represents an integrated circuit chip section on a semiconductor substrate, 41 an external power source outside the integrated circuit chip, 42 an external buffer circuit for supplying a /WE signal outside the integrated circuit chip, 431 to 434 parasitic impedance in wiring from the external power source 41 to the integrated circuit chip section 10.

In the integrated circuit chip 10, an input buffer circuit 131 for receiving an input signal from the outside, for instance a /WE signal, may be constituted of a CMOS Schmitt circuit. A reference character 132 represents a succeeding-stage circuit constituted of, for instance, a CMOS inverter circuit, connected to the output of the input buffer circuit 131, and 133 a third stage circuit constituted of, for instance, a CMOS inverter circuit, connected to the output of the succeeding-stage circuit 132. These circuits 132 and 133 constitute a portion of the internal circuit. To the final stage of the internal circuit, an output buffer circuit 134 is connected for outputting an output signal to the outside.

The input buffer CMOS Schmitt circuit 131 is connected between a power source potential supply node and a ground potential supply node in series. The input buffer CMOS Schmitt circuit 131 comprises a PMOS transistor P1 and NMOS transistors N1 and N2 whose respective gates are commonly connected and a NMOS transistor N3 connected to the NMOS transistor N1 in parallel.

The CMOS inverter circuit 132 for the succeeding-stage circuit is connected between the power source potential supply node and the ground potential supply node in series. The CMOS inverter circuit 132 comprises a PMOS transistor P2 and a NMOS transistor N4 whose respective gates are commonly connected.

The CMOS inverter circuit 133 for the third stage circuit is connected between the power source potential supply node and the ground potential supply node in series. The CMOS inverter circuit 133 comprises a PMOS transistor P3 and a NMOS transistor N4.

A power supply line 100 is connected between the power supply terminal 1 and the power source potential supply node of each of the circuits, a first ground conductor 101 (i.e., a ground conductor exclusively for the input buffer 131) is connected between a first ground terminal 2a and the ground potential supply node of the input buffer 131, and a second ground conductor 102 separated from the first ground conductor 101 is connected between a second ground terminal 2b and the ground potential supply node of the internal circuit (inverter circuits 132 and 133).

A reference character 103 represents a third ground conductor connected to the ground potential supply node of the output buffer 134. The third ground conductor 103 is separated from the first ground conductor 101. In the embodiment, the third ground conductor 103 is commonly formed with the second ground conductor 102.

Now, the operation of the circuit shown in FIG. 2 will be described.

Upon receiving the /WE signal, the input buffer 131 provides its inversion signal WE to a node M2. Upon receiving the WE signal, the succeeding-stage circuit 132 outputs its inversion signal /WE to a node M3. Upon receiving the inversion signal /WE, the third stage circuit 133 outputs its inversion signal WE to a node M4 and controls the operation of the circuit (not shown) in the next stage.

For a read operation in the fast page mode of the DRAM of FIG. 1, as shown in FIG. 10, output data Dout is output in the active period of a /CAS signal and in the non-active period the output is placed in a high impedance state.

For a read operation in the hyper page mode of the DRAM of FIG. 1, as shown in FIG. 10, output data Dout is switched in synchronization with the leading edge of the /CAS signal. Changing of the output data in the hyper page mode is carried out between the high level "H" and the low level "L".

Figure 3:
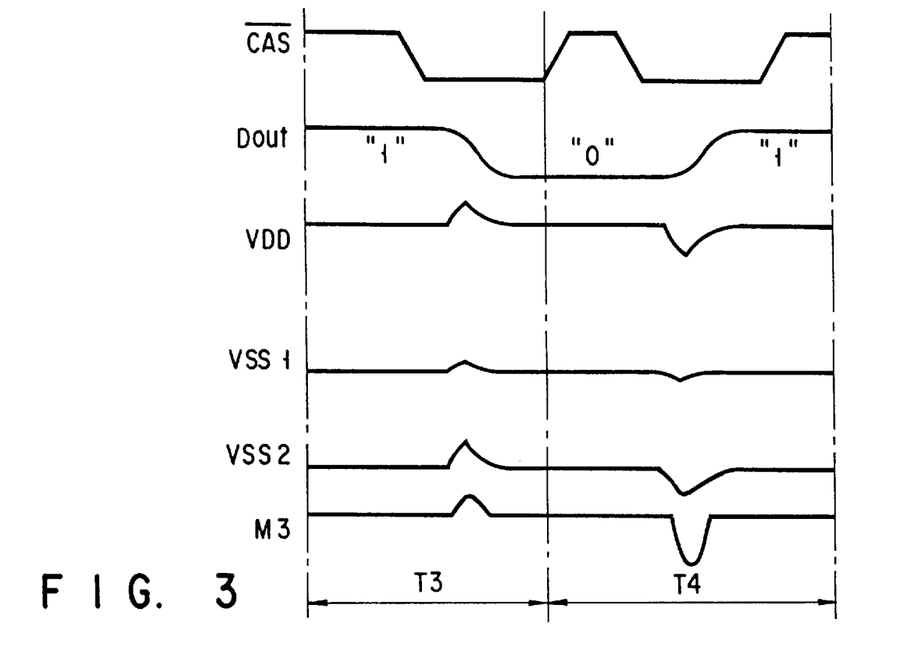
FIG. 3 is a wave form chart showing in detail an example of potential changes of a /CAS signal, an output data Dout, a power supply line, a first ground conductor, a second ground conductor and an output node of an internal circuit in a hyper page mode of the DRAM of FIG. 1.

FIG. 3 shows in detail an example of changes in the /CAS signal in the hyper page mode, the output data Dout, the potential VDD of the power supply line 100, the potential VSS1 of the first ground conductor 101, the potential VSS2 of the second ground conductor 102 and the potential of the node M3 of the internal circuit.

In the initial state of the period T3, Dout may be output at high level "1". Then, it is assumed that when the leading edge of the /CAS signal (trailing edge in this example) is received, Dout changes to a low level "0".

In this situation, since electric charges stored in a load capacitor outside the chip are discharged to the second ground conductor 102, the potential VSS2 of the second ground conductor 102 is caused to float up because of impedance from the ground conductor 102 to the external power source 41. In the chip, a considerably large parasitic capacitance exists between the power supply line 100 and the second ground conductor 102. Thus, by means of the coupling effect, the potential VDD of the power supply line 100 also floats up. That is, the potential VDD of the power supply line 100 and the potential VSS2 of the ground conductor 102 float up in same-phase. On the other hand, since no discharge currents flow to the first ground conductor 101 and parasitic capacitance which exists between the power supply line 100 in the chip and the ground conductor 101 is so small as to be negligible, almost no fluctuations will occur in the potential VSS1 of the first ground conductor 101.

During the period T4 after the end of the active period of the /CAS signal prescribed by DRAM specifications, in the initial state, Dout is maintained in its state of the period T3. It is assumed, then, that the /CAS signal falls again after having been maintained at the high level, Dout changes to a high level "1".

In this situation, since the load capacitor outside the chip is charged by Dout at the high level "1", the potential VDD of the power supply line 100 falls because of impedance from the power supply line 100 to the external power source 41. In the chip, considerably large capacitance exists between the power supply line 100 and the ground conductor 102. By means of the coupling effect, the potential VSS2 of the second ground conductor 102 also falls and thus, the potential VDD of the power supply line 100 and the potential VSS2 of the ground conductor 102 fall in same phase. To the contrary, since parasitic capacitance involved between the power supply line 100 and the first ground conductor 101 is so small as to be negligible, there will be almost no fluctuations in the potential VSS1 of the first ground conductor 101.

That is, in the DRAM of a multibit structure of the first embodiment described above, by providing the ground conductor 101 exclusively for the input buffers 131, it is possible to suppress fluctuations in potential differences between the signal input node and the ground potential supply node of the input buffer circuit 131 (that is, a voltage margin with regard to the external input signal is advanced). Therefore, especially in the DRAM of a multibit structure, even when output noises (fluctuations in the power source potential or the ground potential) are large following a change in output data, the input buffer circuit will be prevented from malfunctioning due to the output noises.

To explain it from a viewpoint different from the above, the semiconductor integrated circuit of the first embodiment is provided with ground conductors separated into a plurality of routes on a semiconductor substrate, a first circuit for receiving an input signal from the outside and a second circuit for receiving the output of the first circuit. The first ground conductor, one of the ground conductors separated into the plurality of routes, is used as a ground conductor only for the first circuit, and those other than the first ground conductor are used as ground conductors for the circuits other than the first circuit.

In the DRAM of a multibit structure of the above-noted first embodiment, during outputting of an output signal from the output buffer circuit 134, the /WE signal is set in a high impedance state. As shown in FIG. 3, there is a possibility that while output data Dout changes, the potential of the output node M3 of the succeeding-stage circuit 132 of the input buffer circuit 131 for /WE signal input may greatly change, leading to malfunction of the third stage inverter circuit 133. This will now be described in detail.

When the /WE signal is in a high impedance state, the electric charge of the output node M2 of the CMOS Schmitt circuit 131 is discharged to the first ground conductor 101. Then, the potential of the node M2 becomes equal to the potential VSS1 of the first ground conductor 101 and the potential of the output node M3 of the CMOS inverter circuit becomes a "H" level.

At this time, the potential of the signal input node of the CMOS inverter circuit 132 is equal to the potential VSS1 of the first ground conductor 101, the potential of the ground potential supply node is equal to the potential VSS2 of the second ground conductor 102 and thus, the CMOS inverter circuit is driven between the two ground potentials VSS1 and VSS2 separated from each other.

Therefore, when the Dout changes from the high level "1" to the low level "0" as described above, the potential VSS2 of the second ground conductor 102 will temporarily float up while no changes occur in the potential of the output node M2 of the CMOS Schmitt circuit 131. At this time, in the CMOS inverter circuit 132, the circuit threshold value will substantially fall and the potential of its output node M3 will temporarily increase.

When Dout changes from the low level "0" to the high level "H" as described above, the potential VSS2 of the second ground conductor 102 will temporarily fall while no changes occur in the potential of the output node M2 of the CMOS Schmitt circuit 131. At this time, in the CMOS inverter circuit, the circuit threshold value will substantially increase and the potential of its output node M3 will temporarily fall. In this manner, since a glitch is produced, the third stage circuit 133 will be prevented from malfunctioning.

As shown in the circuit of the embodiment of FIG. 2, where the first ground conductor 101 for the input buffer circuit 131 and the second ground buffer 102 for the succeeding-stage circuit 132 are separated from each other, there is a possibility that a potential difference between the separated two ground potentials VSS1 and VSS2 may change at the time of an output change, producing a glitch, and because of the glitch malfunction will occur in the third stage circuit and thereafter.

Figure 4:
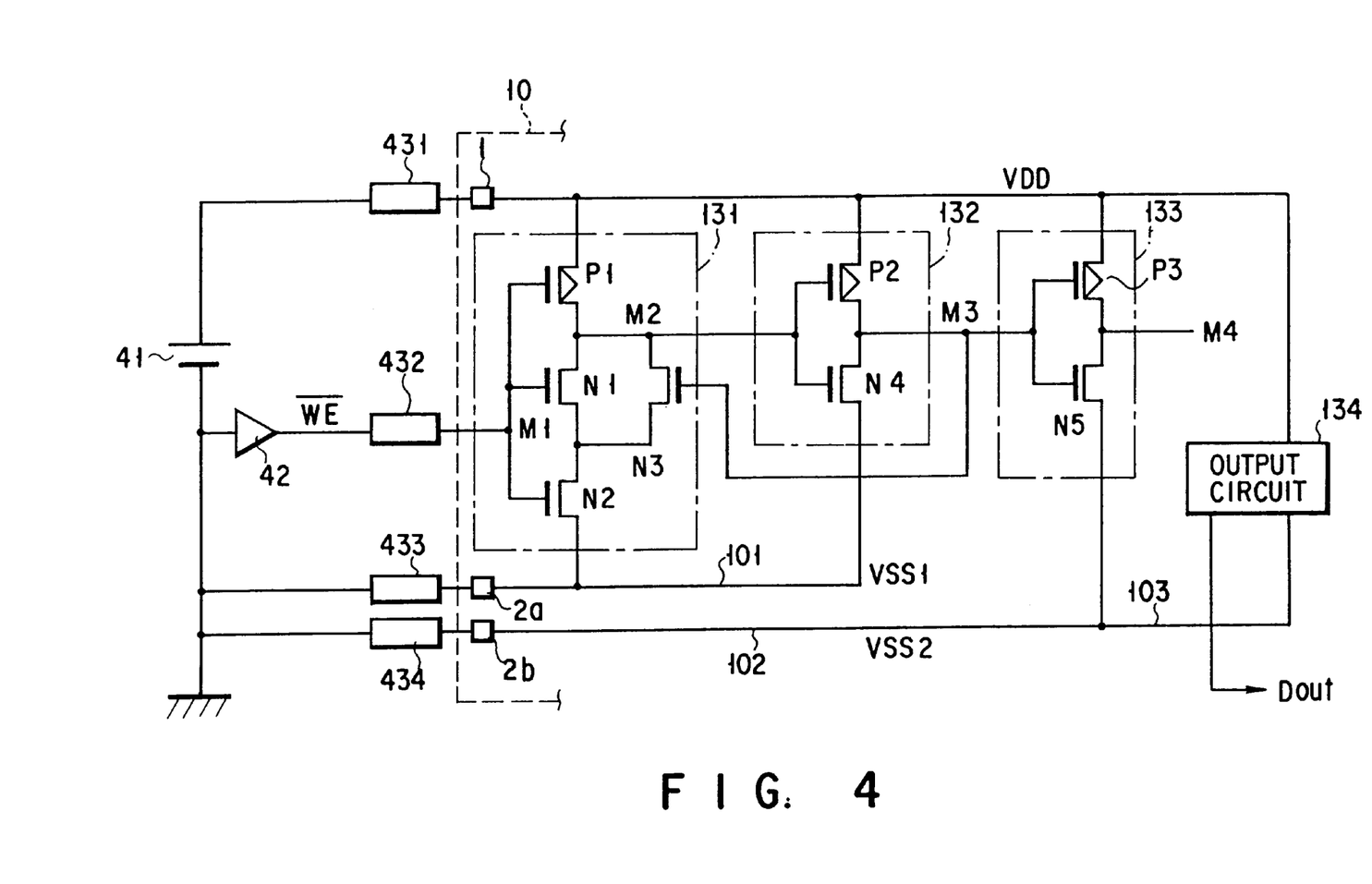
FIG. 4 is a circuit diagram showing an input buffer circuit for /WE input and its peripheral circuit of a DRAM of a multibit configuration in a second embodiment of a semiconductor integrated circuit of the invention and an external structure of an integrated circuit chip associated therewith.

FIG. 4 illustrates an input buffer circuit for /WE input and the peripheral circuit of a DRAM of a multibit structure in a second embodiment of the semiconductor integrated circuit of the invention and an external structure of an integrated circuit chip associated therewith.

The circuit structure shown in FIG. 4 is different from the circuit structure shown in FIG. 2 in that the first ground conductor 101 is connected to the input buffer circuit 131 and the succeeding-stage circuit 132 and the second ground conductor 102 is connected from the succeeding-stage circuit 132 to the internal circuits in the succeeding stages (including the third stage circuit 133 and the output buffer circuit 134). Others are substantially the same and the same reference numerals are used for the same parts as in FIG. 2.

Figure 5:
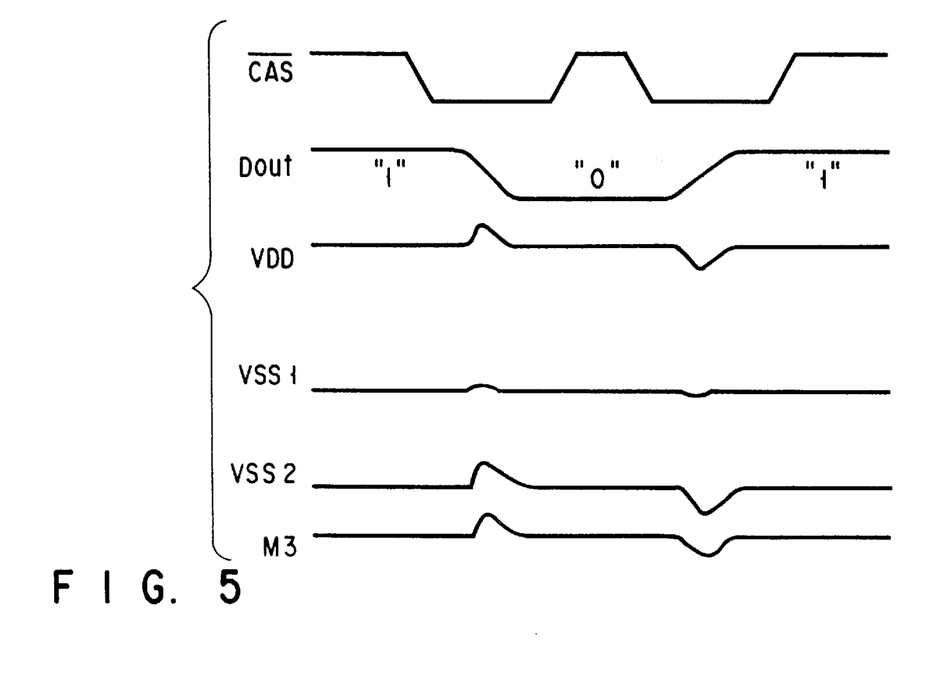
FIG. 5 is a wave form chart showing in detail an example of potential changes of a /CAS signal, an output data Dout, a power supply line, a first ground conductor, a second ground conductor and an output node of an internal circuit in a hyper page mode of the DRAM of FIG. 4.

FIG. 5 shows in detail an example of changes in a /CAS signal, output data Dout, the potential VDD of the power supply line 100, the potential VSS1 of the first ground conductor 101, the potential VSS2 of the second ground conductor 102 and the potential of the node M3 of the internal circuit, in the hyper page mode of the DRAM having the circuit structure as shown in FIG. 4.

In comparison with the operation of the circuit shown in FIG. 2 (see FIG. 3), the operation of the circuit shown in FIG. 4 is (1) basically similar thereto and as described by referring to FIG. 3, the voltage margin with regard to the external input signal has been improved, and (2) the operation of the succeeding-stage circuit 132 to which the first ground conductor 101 is connected is different therefrom, a glitch is prevented from being produced in the output node M3 of the succeeding-stage circuit 132 during changing of the output and thus, malfunction of the internal circuit is prevented.

That is, while the output buffer circuit 134 outputs output data Dout, a /WE signal is set in a high impedance state.

While the /WE signal is set in the high impedance state, the electric charge of the output node M2 of the input buffer circuit (CMOS Schmitt circuit) 131 is discharged to the first ground conductor 101, the potential of the output node M2 becomes equal to the potential VSS1 of the first ground conductor 101 and the potential of the output node M3 of the succeeding-stage circuit (CMOS inverter circuit) becomes a "H" level. The potential of the signal input node and the potential of the ground potential supply node of the succeeding-stage circuit 132 are respectively equal to the potential VSS1 of the first ground conductor 101.

Therefore, when the output data Dout changes from the high level "1" to the low level "0" as described above, no changes will occur in the potential of the output node M2 of the input buffer circuit 131 while the potential of VSS2 of the second ground conductor 102 temporarily floats up. Almost no changes occur in the potential VSS1 of the first ground conductor 101, either, and thus no glitches will be produced in the output node M3 of the succeeding-stage circuit 132. At this time, in the third stage circuit 133, the potential of its signal input node is equal to a power source potential VDD and the potential of the ground potential supply node is equal to the potential VSS2 of the second ground conductor 102. However, since the power source potential VDD and the potential VSS2 of the second ground conductor 102 fluctuate in same phase, malfunction of the third circuit 133 will be prevented.

When the output data Dout changes from the low level "0" to-the high level "1" as described above, no changes will occur in the potential of the output node M2 of the input buffer circuit 131 while the potential VSS2 of the second ground conductor 102 temporarily falls. Almost no changes will occur in the potential VSS1 of the first ground conductor 101, either, and thus no glitches will be produced in the output node M3 of the succeeding-stage circuit 132. At this time, in the third stage circuit 133, the potential of its signal input node M3 is equal to the power source potential VDD and the potential of the ground potential supply node is equal to the potential VSS2 of the second ground conductor 102. However, since the power source potential VDD and the potential VSS2 of the second ground conductor 102 fluctuate in same phase, malfunction of the third stage circuit 133 will be prevented.

Furthermore, as described previously, when the potential VDD of the power supply line 100 fluctuates even while the potential VSS1 of the first ground conductor 101 does not change during changing of the output, the drive voltage change between the power source nodes and the ground nodes of the input buffer circuit 131 and the succeeding-stage circuit 132. In order to prevent the change of the drive voltage, it is desired to form a power supply line exclusively for the input buffer circuit 131 and the succeeding-stage circuit 132 differently from a power supply line for other circuits.

Figure 6:
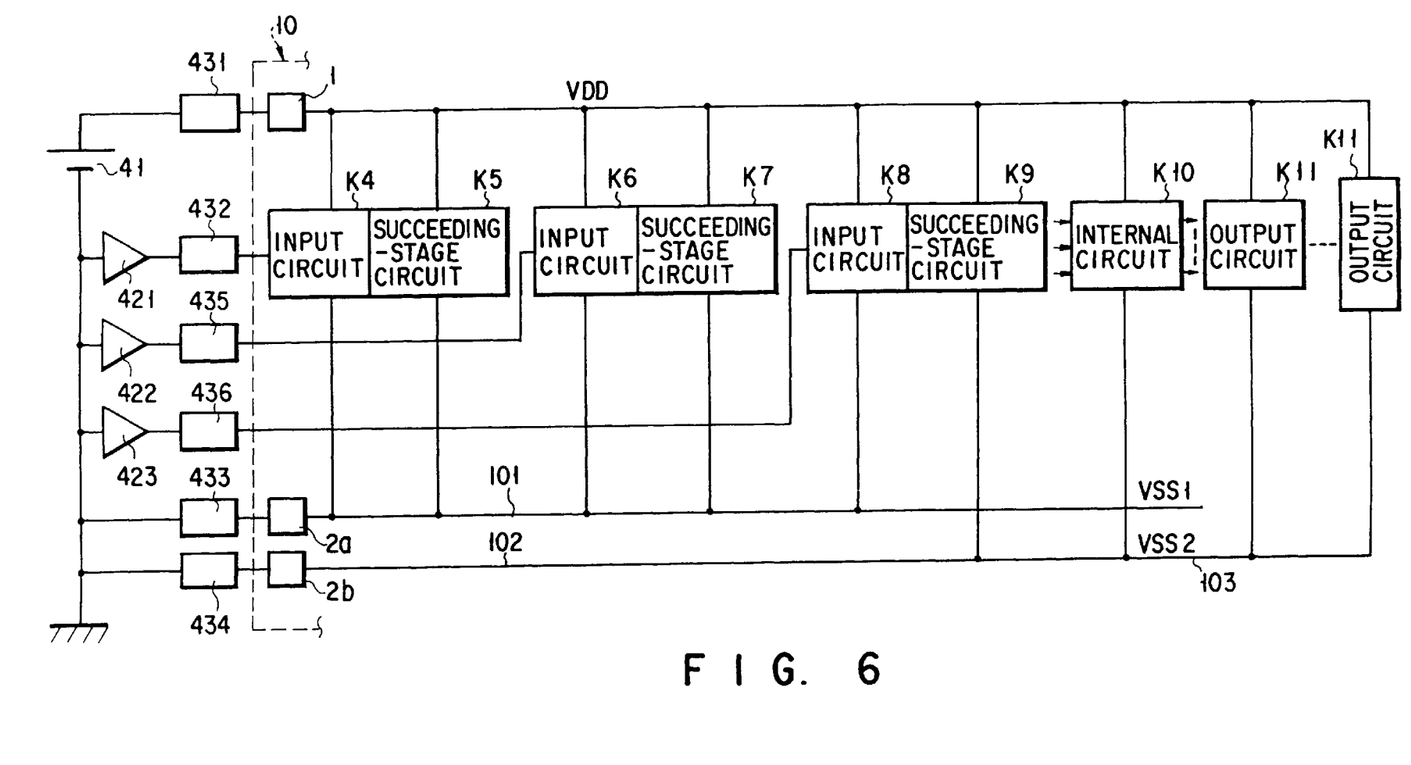
FIG. 6 is a block diagram showing a plurality of input buffer circuits and their peripheral circuits of a DRAM of a multibit configuration in a third embodiment of a semiconductor integrated circuit of the invention and an external structure of an integrated circuit chip associated therewith.

FIG. 6 illustrates a plurality of input buffer circuits and their peripheral circuits of a DRAM of a multibit structure in a third embodiment of the semiconductor integrated circuit of the invention and an external structure of an integrated circuit chip associated therewith.

The DRAM of the third embodiment is provided with a plurality of input circuits (e.g., CMOS Schmitt circuit) K4, K6 and K8 for receiving different input signals from the outside, a plurality of succeeding-stage circuits (e.g., CMOS inverter circuit) K5, K7 and K9 connected to the plurality of input circuits in a corresponding manner, an internal circuit K10 connected to the succeeding-stage circuits, a plurality of output circuits K11 connected to the internal circuit for outputting output signals to the outside, a power supply line 100 connected to each of the circuits, a power supply terminal 1 connected to the power supply line, a first ground conductor 101 connected to the plurality of input circuits and some of the plurality of succeeding-stage circuits, a second ground conductor 102 separated from the first ground conductor and connected to the internal circuit and the rest of the plurality of succeeding-stage circuits, a third ground conductor 103 separated from the first ground conductor and connected to the output circuits, a first ground terminal 2a connected to the first ground conductor and a second ground terminal 2b connected to the second ground conductor.

The structure of the circuit shown in FIG. 6 comprises a first circuit section in which the first and second ground conductors 101 and 102 are connected respectively to the input circuit and the succeeding-stage circuit as shown in FIG. 2 and a second circuit section in which the first ground conductor 101 is commonly connected to the input circuit and the succeeding-stage circuit as shown in FIG. 4.

In FIG. 6, reference numerals 421 to 423 represent external buffer circuits outside the integrated circuit chip, 431 to 436 parasitic impedance in a wiring from the external power source 41 to the integrated circuit chip 10, K4, K6 and K8 input circuits, K5, K7, K9 succeeding-stage circuits, K10 an internal circuit and K11 output circuits. For other parts, the same reference numerals as in FIGS. 2 and 4 are used.

In this case, an input signal (e.g., /RAS) at a low level during outputting of an output signal from the output circuit K11 is input to the first circuit section while an input signal (e.g., /WE) placed in a high impedance state during outputting of the output signal from the output circuit K11 is input to the second circuit section.

Thus, in the second circuit section, an operation similar to that of the circuit shown in FIG. 4 is performed. In this case, in the second circuit section, if the number of invention circuits contained in the circuits (input and succeeding-stage circuits) up to the internal circuit to be prevented from malfunctioning due to output noises of a plurality of internal circuits is an even number, an operation similar to that of the circuit shown in FIG. 4.

In the first circuit section, while the input signal of a low level has been input, the output node of its input circuit is at a power source potential VDD. When output data Dout changes, though the potential VSS2 of the second ground conductor 102 temporarily changes, the potential of the output node of the input circuit will not change. Almost no changes will occur in the potential VSS1 of the first ground conductor, either. In the succeeding-stage circuit, the potential of its signal input node is equal to the power source potential VDD and the potential of the ground potential supply node is equal to the potential VSS2 of the second ground conductor 102. However, since the power source potential VDD and the potential VSS2 of the second ground conductor 102 fluctuate in same phase, malfunction will be prevented. In this case, in the first circuit section, if the number of inversion circuits contained in the circuit (input buffer circuit) up to the internal circuit to be prevented from malfunctioning due to output noises is an odd number, the operation as described above will be performed.

To explain it from a viewpoint different from the above, the DRAM of the third embodiment is provided with ground conductors separated into a plurality of routes on a semiconductor substrate, a plurality of first circuits for respectively receiving different input signals from the outside and a plurality of second circuits for receiving outputs from the plurality of first circuits in a corresponding manner. A first ground conductor, one of the ground conductors separated into the plurality of routes, is used as a ground conductor only for the plurality of first circuits and some of the succeeding-stage circuits of the plurality of second circuits. The ground conductors other than the first ground conductor are used as ground conductors for the circuits other than the first an second circuits and the rest of the succeeding-stage circuits of the plurality of second circuits.

Figure 7:
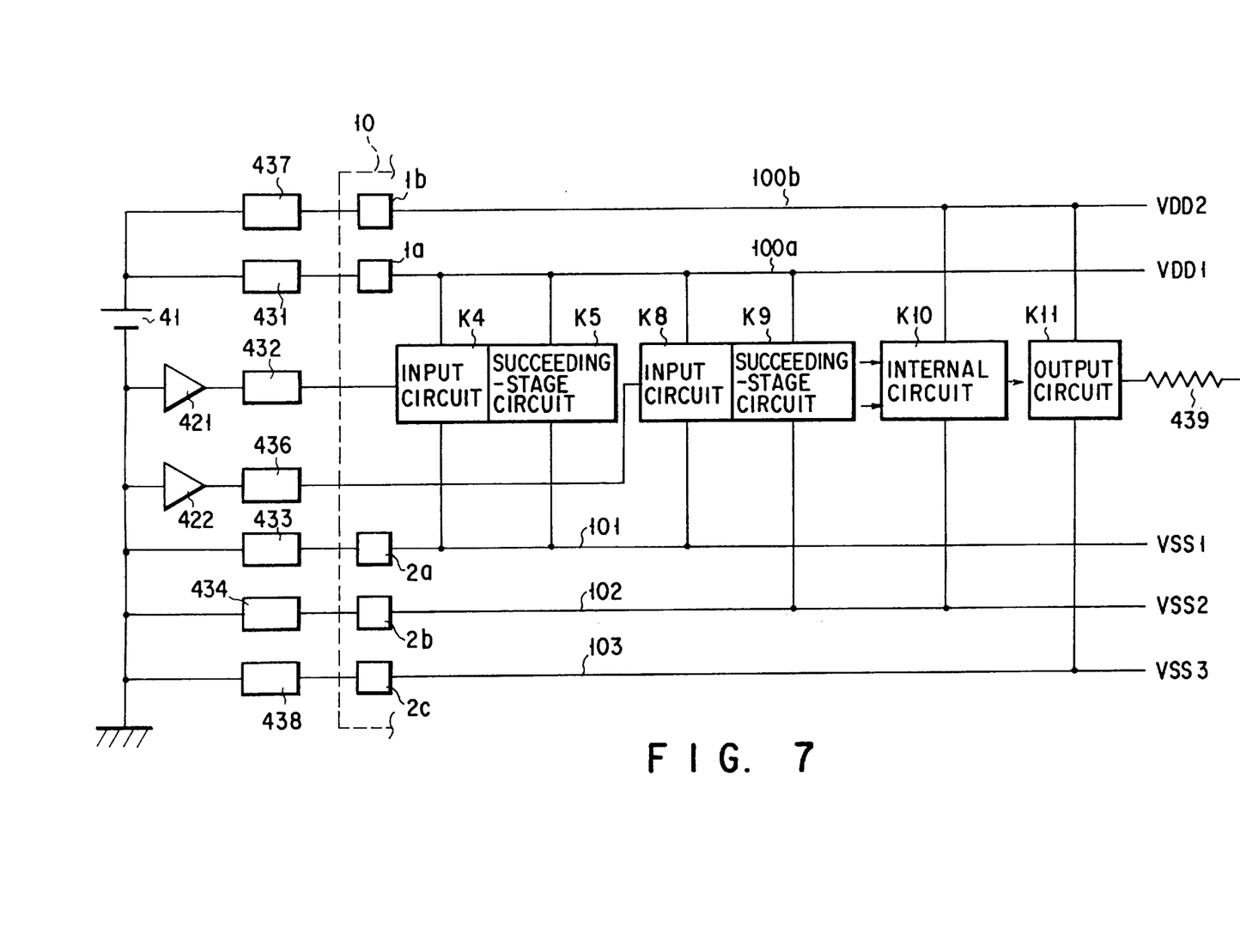
FIG. 7 is a block diagram showing a plurality of input buffer circuits and their peripheral circuits of a DRAM of a multibit configuration in a fourth embodiment of a semiconductor integrated circuit of the invention and an external structure of an integrated circuit chip associated therewith.

FIG. 7 illustrates a plurality of input buffer circuits and their peripheral circuits of a DRAM of a multibit structure in a fourth embodiment of the semiconductor integrated circuit of the invention and an external structure of an integrated circuit chip associated therewith.

The DRAM of the fourth embodiment is different from that of the third embodiment described by referring to FIG. 6 in that (1) the power supply line 100 comprises a first power supply line 100a commonly connected to the input circuits K4 and K8, the succeeding circuits K5 and K9 and the internal circuit K10 and a second power supply line 100b separated from the first power supply line 100a and connected to the output circuit K11, (2) the power supply terminal 1 comprises a first power supply terminal 1a connected to the first power supply line 100a and a second power supply terminal 1b connected to the second power supply line 100b and (3) the second and third ground conductors 102 and 103 are separated, the ground conductor 103 is used exclusively for the output circuit K11 and a third ground terminal 2c connected to the third ground conductor 103 is further provided. Since parts other than these parts are substantially the same, the same reference characters are used for the same parts as in FIG. 6. In FIG. 7, 437 and 438 represent impedance parasitic in a wiring from the external power source 41 to the integrated circuit chip 10 and 439 parasitic impedance from the output circuit to an external load.

According to the DRAM of the fourth embodiment, since the power supply line 100b exclusively for the output circuit and the ground conductor 103 are separated from the power supply line 100a and the ground conductors 101 and 102 for the other circuits, it will be difficult for fluctuations to occur in the potentials of the power supply line and the ground conductors for the other circuits during changing of the output.

Figure 8A:
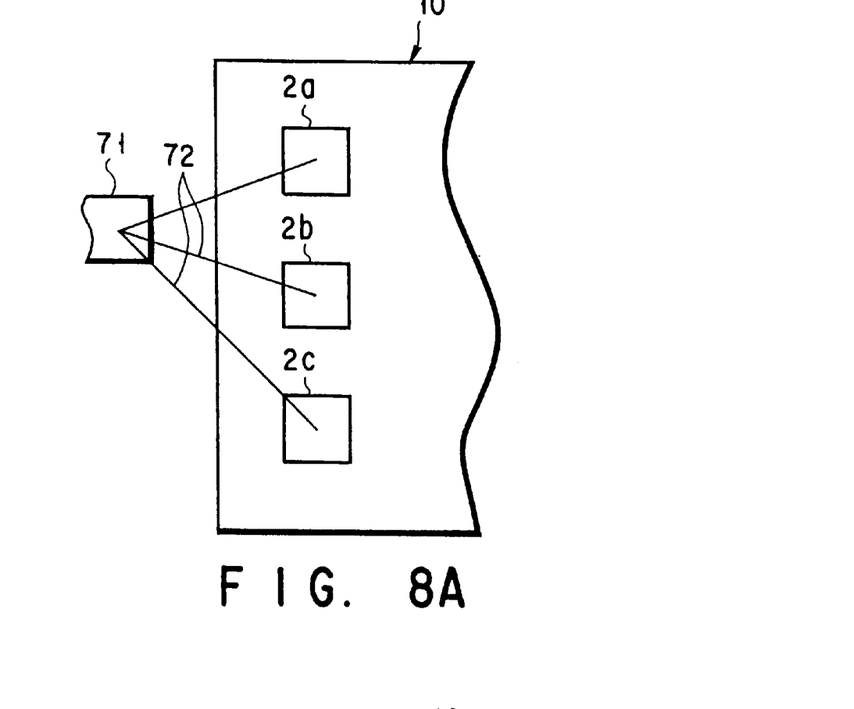
FIGS. 8A and 8B are views showing different examples of a connection between ground terminals (or power supply terminals) separated into a plurality of routes on a semiconductor integrated circuit chip of the invention and terminals outside the integrated circuit chip.
Figure 8B:
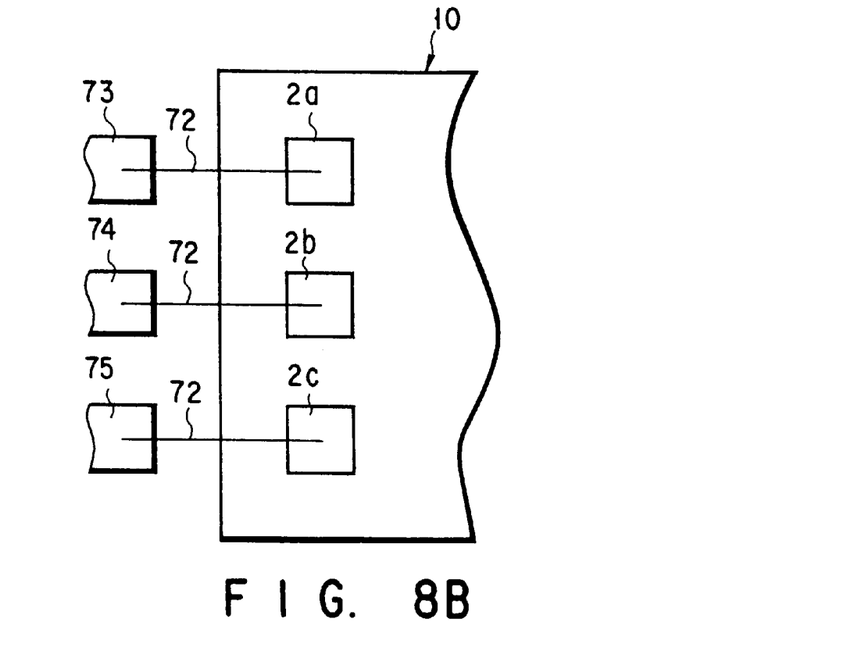

FIGS. 8A and 8B respectively show different examples of a connection between ground terminals separated into a plurality of routes (or power supply terminals) on the semiconductor integrated circuit chip of the invention and terminals outside the integrated circuit chip.

In FIG. 8A, ground pads (or power pads) 2a, 2b and 2c separated into three routes on the integrated circuit chip 10 are shown to be commonly connected to one ground terminal section (or a power supply terminal section) 71 on, for instance, a lead frame outside the integrated circuit chip via a bonding wire 72.

In FIG. 8B, the ground pads (or power pads) 2a, 2b and 2c separated into three routes on the integrated circuit chip 10 are shown to be differently connected to the ground terminals of three routes (or power supply terminals) 73 t0 75 via the bonding wire 72.

Figure 9:
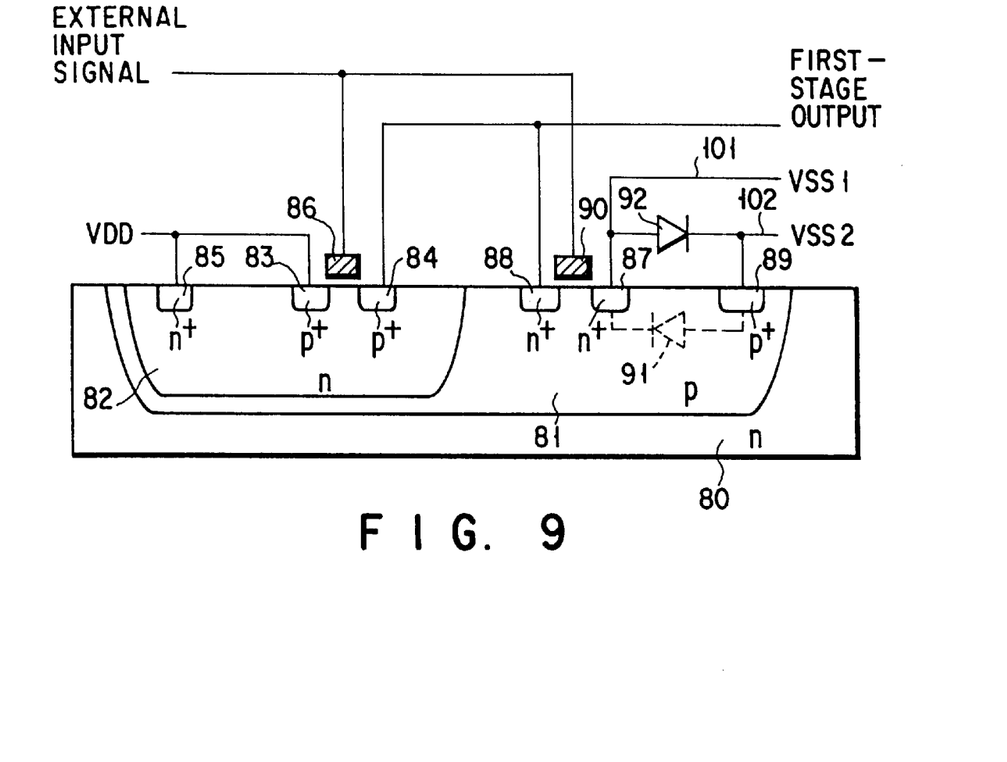
FIG. 9 is a view showing an example of a connection between a cross-sectional structure of a CMOS inverter for an input circuit and ground conductors separated into a plurality of routes in a DRAM of a multibit configuration in a fifth embodiment of a semiconductor integrated circuit of the invention.

FIG. 9 shows an example of a connection between the cross-sectional structure of a CMOS inverter for an input circuit and, for instance, ground conductors of two routes in DRAM of a multibit structure in a fifth embodiment of the semiconductor integrated circuit of the invention.

In the drawing, a reference character 80 represents a n-type semiconductor substrate, 81 a p type well formed in the substrate, and 82 a n type well formed in the p type well.

Reference characters 83 and 84 represent source and drain regions for a PMOS transistor constituted of a p+ type impurity diffused layer formed in a portion of the surface layer section of the n type well 82, 85 a n type well electrode region constituted of a n+ type impurity diffused layer formed in a portion of the surface layer section of the n type well 82 and 86 a gate electrode for a PMOS transistor formed on a channel region between the source and the drain of the PMOS transistor via a gate insulated film.

Reference characters 87 and 88 represent source and drain regions for a NMOS transistor constituted of a n+ type impurity diffused layer formed in a portion of the surface layer section of the p type well 81, 89 a p type well electrode region constituted of a p+ type impurity diffused layer formed in a portion of the surface layer section of the p type well 81 and 90 a gate electrode for a NMOS transistor formed on a channel region between the source and the drain of the NMOS transistor via a gate insulated film.

External input signals are commonly input to the gate electrode 86 for the PMOS transistor and the gate electrode 90 for the NMOS transistor and the drain 84 for the PMOS transistor and the drain 88 for the NMOS transistor are commonly connected to the signal input node of the succeeding-stage circuit.

A power source potential VDD is supplied to the source region 83 for the PMOS transistor and the n type well electrode region 85, the source region 87 for the NMOS transistor is connected to the first ground conductor 101 and the p type well electrode region 89 is connected to the second ground conductor 102.

In such a structure, a p-n junction diode 91 formed between the p type well 81 and the source region 87 for the NMOS transistor exists between the second ground conductor 102 and the first ground conductor 101.

Therefore, as described previously, when the output data of the output circuit changes from "1" to "0", the potential VSS2 of the second ground conductor 102 floats up with no changes in the potential VSS1 of the first ground conductor 101. However, if at this time, a potential difference is generated, exceeding the forward falling voltage $V_F$ of the diode 91, between the second ground conductor 102 and the first ground conductor 101, the diode 91 will be turned ON. Thus, while the potential VSS1 of the first ground conductor floats up, it is possible to suppress a potential difference below $V_F$ between the second ground conductor 102 and the first ground conductor 101.

On the other hand, as described previously, when the output data of the output circuit changes from "0" to "1", the potential VSS2 of the second ground conductor 102 falls without any changes in the potential VSS1 of the first ground conductor 101. At this time, since a reverse bias is applied to the diode 91, the diode 91 will not be turned ON.

In order to turn the diode 91 ON, as shown in FIG. 9, another diode 92 is provided between the second ground conductor 102 and the first ground conductor 101 in a direction opposite the p-n junction diode 91. This enables the diode 92 to be turned ON when the potential VSS2 of the second ground conductor 102 falls and its potential difference from the first ground conductor exceeds the forward falling voltage $V_F$ of the diode 92. In this manner, while the potential VSS1 of the first ground conductor also falls, it is possible to suppress a potential difference below $V_F$ between the first ground conductor 101 and the second ground conductor 102.

Apparent from the foregoing, according to the invention, the semiconductor integrated circuit is provided, wherein it is possible to prevent malfunction of the internal circuit due to output noises accompanying changes in the output data.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:

an input circuit for receiving an input signal supplied from outside said semiconductor integrated circuit;

a succeeding-stage circuit connected to an output of said input circuit, for controlling said input circuit;

a signal line connecting said output of said succeeding-stage circuit with a control terminal of said input circuit, for feeding an output signal of said succeeding-stage circuit back to said control terminal of said input circuit;

an internal circuit connected to an output of said succeeding-stage circuit;

an output circuit connected to said internal circuit for outputting an output signal to the outside;

a power supply line connected to said input circuit, said succeeding-stage circuit, said internal circuit and said output circuit;

a power supply terminal connected to said power supply line;

a first ground conductor connected to said input circuit and said succeeding-stage circuit;

a second ground conductor connected to said internal circuit and said output circuit;

a first ground terminal connected to said first ground conductor; and a second ground terminal connected to said second ground conductor.

2. A semiconductor integrated circuit comprising:

a plurality of separate ground conductors formed on a semiconductor substrate;

an input circuit for receiving an input signal supplied from outside said semiconductor integrated circuit;

a succeeding-stage circuit connected to an output of said input circuit, for controlling said input circuit;

a signal line connecting an output of said succeeding-stage circuit with a control terminal of said input circuit, for feeding an output signal of said succeeding-stage circuit back to said control terminal of said input circuit;

an internal circuit connected to said output of said succeeding-stage circuit;

wherein a first ground conductor of said ground conductors is used as a ground conductor for said input circuit and said succeeding-stage circuit and the ground conductors other than said first ground conductor are used as ground conductors for circuits other than said input circuit and said succeeding-stage circuit.

3. A semiconductor integrated circuit according to claim 2, further comprising:

an output circuit connected to said internal circuit for outputting an output signal to the outside, wherein one of the ground conductors other than said first ground conductor is used exclusively for said output circuit.

4. A semiconductor integrated circuit comprising:

an input circuit for receiving an input signal supplied from outside said semiconductor integrated circuit;

a succeeding-stage circuit connected to the input circuit, for controlling said input circuit;

a signal line connecting said output of said succeeding-stage circuit with a control terminal of said input circuit, for feeding an output signal of said succeeding-stage circuit back to the control terminal of said input circuit;

an internal circuit connected to an output of said input circuit;

an output circuit connected to said internal circuit for outputting an output signal to the outside;

a power supply line connected to said input circuit, said succeeding-stage circuit, said internal circuit, and said output circuit;

a power supply terminal connected to said power supply line;

a first ground conductor connected to said input circuit and said succeeding-stage circuit;

a second ground conductor connected to said internal circuit and said output circuit;

a first ground terminal connected to said first ground conductor; and a second ground terminal connected to said second ground conductor; and wherein the input and succeeding-stage circuits are respectively provided with NMOS transistors formed on a p type well formed in a n-type semiconductor substrate, the first ground conductor is connected to a source region for the NMOS transistor comprising a n-type impurity diffused layer formed in the p type well, the second ground conductor is connected to a p type well electrode region comprising a p-type impurity diffused layer formed in said p type well, and a p-n junction diode formed between the p type well and the source region of said NMOS transistor exists between the second ground conductor and the first ground conductor.

5. A semiconductor integrated circuit according to claim 4, wherein said first and second power supply terminals are connected to first and second external power supply terminals, respectively.

6. A semiconductor integrated circuit according to claim 4, wherein said first and second ground terminals are connected to first and second external ground terminals, respectively.

7. A semiconductor integrated circuit according to claim 5, wherein said first and second ground terminals are connected to first and second external ground terminals, respectively.

8. A semiconductor integrated circuit comprising:

a plurality of separate ground conductors formed on a semiconductor substrate;

a plurality of input circuits for respectively receiving different input signals from the outside;

a plurality of succeeding-stage circuits each of which is connected to an output of a corresponding input circuit;

a signal line connecting an output of each of said succeeding-stage circuits with a control terminal of a corresponding input circuit, for feeding an output signal of said each succeeding-stage circuit back to the control terminal of said corresponding input circuit;

an internal circuit connected to said outputs of said succeeding-stage circuits; and an output circuit connected to said internal circuit for outputting an output signal to the outside, wherein a first ground conductor of said ground conductors is used as a ground conductor for said plurality of input circuits and some of said succeeding-stage circuits, and the ground conductors other than said first ground conductor are used as ground conductors for said internal circuit, said output circuit and the rest of said succeeding-stage circuits.

9. A semiconductor integrated circuit comprising:

a plurality of input circuits for respectively receiving different input signals from the outside;

a plurality of succeeding-stage circuits respectively connected to the plurality of input circuits in a corresponding manner;

a signal line connecting an output of each of said succeeding-stage circuits with a control terminal of a corresponding input circuit, for feeding an output signal of said each succeeding-stage circuit back to said control terminal of said corresponding input circuit;

an internal circuit connected to said input circuits;

a plurality of output circuits connected to said internal circuit for respectively outputting output signals to the outside;

a power supply line connected to said input circuits, said succeeding-stage circuits, said internal circuit, and said plurality of output circuits;

a power supply terminal connected to said power supply line;

a first ground conductor connected to said plurality of input circuits and some of said plurality of succeeding-stage circuits;

a second ground conductor connected to said internal circuit, the rest of said plurality of succeeding-stage circuits, and the output circuits;

a first ground terminal connected to said first ground conductor; and a second ground terminal connected to said second ground conductor.

10. A semiconductor integrated circuit according to claim 9, wherein said some of said plurality of succeeding-stage circuits are CMOS inverter circuits, the ones of said input circuits which are connected to said CMOS inverter circuits are CMOS Schmitt circuits, and input signals input to said CMOS Schmitt circuits set the CMOS Schmitt circuits in a high impedance state while said output circuits provide output signals.

11. A semiconductor integrated circuit according to claim 9, wherein said rest of said plurality of succeeding-stage circuits are CMOS inverter circuits, one of said input circuits which are connected to said CMOS inverter circuits are CMOS Schmitt circuits, and input signals input to said CMOS Schmitt circuits cause said Schmitt circuits to be low levels while the output circuits provide output signals.

12. A semiconductor integrated circuit according to claim 1, wherein said input circuit comprises a MOS transistor having a gate to which the input signal is supplied.

13. A semiconductor integrated circuit according to claim 2, wherein said input circuit comprises a MOS transistor having a gate to which the input signal is supplied.

14. A semiconductor integrated circuit according to claim 4, wherein said input circuit comprises a MOS transistor having a gate to which the input signal is supplied.

15. A semiconductor integrated circuit according to claim 8, wherein each of said input circuits comprises a MOS transistor having a gate to which the respective input signal is supplied.

16. A semiconductor integrated circuit according to claim 9, wherein each of said input circuits comprises a MOS transistor having a gate to which the respective input signal is supplied.

17. A semiconductor integrated circuit comprising:

an input terminal for receiving an input signal;

an output terminal for outputting an output signal;

a power supply terminal;

a power supply line connected to said power supply terminal;

first and second ground terminals;

a first ground line connected to said first ground terminal;

a second ground line connected to said second ground terminal;

an input circuit connected to said input terminal, said input circuit connected to said power supply line and said first ground line;

an output circuit connected to said output terminal, said output circuit connected to said power supply line and said second ground line;

a succeeding-stage circuit connected to said input circuit, said succeeding-stage circuit comprising one stage which is connected to said power supply line and said first ground line;

a signal line connecting an output of said succeeding-stage circuit with a control terminal of said input circuit, for feeding an output signal of said one stage of said succeeding-stage circuit back to said control terminal of said input circuit; and an internal circuit connected between said succeeding-stage circuit and said output circuit, said internal circuit connected to said power supply line and said second ground line.

18. A semiconductor integrated circuit according to claim 17, wherein said first and second ground terminals are connected to the same external ground terminal via respective bonding wires.

19. A semiconductor integrated circuit according to claim 17, wherein said first and second ground terminals are connected to different external ground terminals via respective bonding wires.

20. A semiconductor integrated circuit according to claim 17, wherein said at least one stage comprises a stage connected to an output of said input circuit.

21. A semiconductor integrated circuit according to claim 17, wherein said input circuit comprises a MOS transistor having a gate to which the input signal is supplied.

22. A semiconductor integrated circuit comprising:

input terminals, each input terminal receiving a respective input signal;

output terminals, each output terminal outputting a respective output signal;

a power supply terminal;

a power supply line connected to said power supply terminal;

first and second ground terminals;

a first ground line connected to said first ground terminal;

a second ground line connected to said second ground terminal;

input circuits, each input circuit connected to a corresponding input terminal and each input circuit connected to said power supply line and said first ground line;

output circuits, each output circuit connected to a corresponding output terminal and each output circuit connected to said power supply line and said second ground line;

a succeeding-stage circuit connected to said input circuits, said succeeding-stage circuit comprising stages, first ones of said stages connected to said power supply line and said first ground line and second ones of said stages connected to said power supply line and said second ground line;

a first signal line connecting an output of each of said first ones of said stages of said succeeding-stage circuit with a control terminal of a corresponding one of said input circuits, for feeding an output signal of said each first one of said stages of said succeeding-stage circuit back to said control terminal of said corresponding one of said input circuits;

a second signal line connecting an output of each of said second ones of said stages of said succeeding-stage circuit with a control terminal of a corresponding one of said input circuits, for feeding an output signal of said each second one of said stages of said succeeding-stage circuit back to said control terminal of said corresponding one of said input circuits; and an internal circuit connected between said input circuits and said succeeding-stage circuit, said internal circuit connected to said power supply line and said second ground line.

23. A semiconductor integrated circuit according to claim 22, wherein said first and second ground terminals are connected to the same external ground terminal via respective bonding wires.

24. A semiconductor integrated circuit according to claim 22, wherein said first and second ground terminals are connected to different external ground terminals via respective bonding wires.

25. A semiconductor integrated circuit according to claim 22, wherein each of said stages is connected to an output of a corresponding one of said input circuits.

26. A semiconductor integrated circuit according to claim 22, wherein each of said input circuits comprises a MOS transistor having a gate to which the respective input signal is supplied.

27. A semiconductor integrated circuit comprising:

input terminals, each input terminal receiving a respective input signal;

an output terminal for outputting an output signal;

first and second power supply terminals;

a first power supply line connected to said first power supply terminal;

a second power supply line connected to said second power supply terminal;

first, second and third ground terminals;

a first ground line connected to said first ground terminal;

a second ground line connected to said second ground terminal;

a third ground line connected to said second ground terminal;

input circuits, each input circuit connected to a corresponding one of input terminal and each input circuit connected to said power supply line and said first ground line;

an output circuit connected to said output terminal, said output circuit connected to said second power supply line and said third ground line;

a succeeding-stage circuit connected to said input circuits, said succeeding-stage circuit comprising stages, first ones of said stages connected to said first power supply line and said first ground line, and second ones of said stages connected to said first power supply line and said second ground line;

a first signal line connecting an output of each of said first ones of said stages of said succeeding-stage circuit with a control terminal of a corresponding one of said input circuits, for feeding an output signal of said each first one of said stages of said succeeding-stage circuit back to said control terminal of said corresponding one of said input circuits;

a second signal line connecting an output of each of said second ones of said stages of said succeeding-stage circuit with a control terminal of a corresponding one of said input circuits, for feeding an output signal of said each second one of said stages of said succeeding-stage circuit back to said control terminal of said corresponding one of said input circuits; and an internal circuit connected between said input circuits and said output circuit, said internal circuit connected to said second power supply line and said second ground line.

28. A semiconductor integrated circuit according to claim 27, wherein said first, second, and third ground terminals are connected to the same external ground terminal via respective bonding wires.

29. A semiconductor integrated circuit according to claim 27, wherein said first, second, and third ground terminals are connected to different external ground terminals via respective bonding wires.

30. A semiconductor integrated circuit according to claim 27, wherein said first and second power supply lines are connected to the same external power terminal via respective bonding wires.

31. A semiconductor integrated circuit according to claim 27, wherein said first and second power supply lines are connected to different external power terminals via respective bonding wires.

32. A semiconductor integrated circuit according to claim 27, wherein each of said input circuits comprises a MOS transistor having a gate to which the respective input signal is supplied.

33. A semiconductor integrated circuit comprising:

a plurality of input circuits for respectively receiving different input signals from the outside;

a plurality of succeeding-stage circuits respectively connected to the plurality of input circuits in a corresponding manner;

a signal line connecting an output of each of said succeeding-stage circuits with a control terminal of a corresponding input circuit, for feeding an output signal of said each succeeding-stage circuit back to said control terminal of said corresponding input circuit;

an internal circuit connected to said input circuits;

an output circuit connected to said internal circuit for outputting an output signal to the outside;

a first power supply line connected to said input circuits and said succeeding-stage circuits;

a second power supply line connected to said internal circuit and said output circuit;

a first power supply terminal connected to said first power supply line;

a second power supply terminal connected to said second power supply line;

a first ground conductor connected to said plurality of input circuits and some of said plurality of succeeding-stage circuits;

a second ground conductor connected to said internal circuit and the rest of said plurality of succeeding-stage circuits;

a third ground conductor connected to said output circuit;

a first ground terminal connected to said first ground conductor;

a second ground terminal connected to said second ground conductor; and a third ground terminal connected to said third ground conductor.

34. A semiconductor integrated circuit according to claim 33;

wherein said some of said plurality of succeeding-stage circuits are CMOS inverter circuits, the ones of the plurality of input circuits which are connected to said CMOS inverter circuits are CMOS Schmitt circuits, and input signals input to said CMOS Schmitt circuits set the CMOS Schmitt circuits in a high impedance state while said output circuits provide output signals.

35. A semiconductor integrated circuit according to claim 33;

wherein said rest of said plurality of succeeding-stage circuits are CMOS inverter circuits, the one of said input circuits which are connected to said CMOS inverter circuits are CMOS Schmitt circuits, and input signals input to said CMOS Schmitt circuits cause said Schmitt circuits to be low levels while the output circuits provide output signals.

* * * * *